United States Patent
Dzengeleski et al.

(10) Patent No.: US 8,698,108 B1
(45) Date of Patent: Apr. 15, 2014

(54) ION BEAM MEASUREMENT SYSTEM AND METHOD

(71) Applicant: Varian Semiconductor Equipment Associates, Inc., Gloucester, MA (US)

(72) Inventors: Joseph P. Dzengeleski, Hampton, NH (US); Eric Hermanson, Georgetown, MA (US); Robert J. Mitchell, Winchester, MA (US); Tyler Rockwell, Wakefield, MA (US); James W. Wilkinson, Topsfield, MA (US); James Paul Buonodono, Amesbury, MA (US); Frank Sinclair, Quincy, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/790,791

(22) Filed: Mar. 8, 2013

(51) Int. Cl.
*H01J 37/09* (2006.01)
*H01J 37/317* (2006.01)
*H01L 21/265* (2006.01)

(52) U.S. Cl.
USPC .......... 250/492.21; 250/492.3; 250/489; 250/397; 250/505.1

(58) Field of Classification Search
USPC ............ 250/492.21, 492.3, 489, 397, 505.1
See application file for complete search history.

(56) References Cited

U.S. PATENT DOCUMENTS

| | | | |
|---|---|---|---|
| 6,545,419 B2* | 4/2003 | Vella | 315/111.21 |
| 8,481,960 B2* | 7/2013 | Radovanov et al. | 250/396 R |
| 2009/0179158 A1* | 7/2009 | Stone et al. | 250/423 R |

* cited by examiner

*Primary Examiner* — Nikita Wells

(57) ABSTRACT

A system of measuring ion beam current in a process chamber using conductive liners is disclosed. A conductive liner is used to shield the walls of the process chamber. An ion measuring device, such as an ammeter, is used to measure the current created by the ions that impact the conductive liner. In some embodiments, a mechanism to contain secondary electrons generated in the process chamber is employed. Additionally, the ions that impact the scan system or workpiece may also be measured, thereby allowing the current of the entire ion beam to be measured.

18 Claims, 3 Drawing Sheets

ION BEAM MEASUREMENT SYSTEM AND METHOD

Embodiments of the present invention relate to systems and methods for ion beam current measurement in a process chamber, and more particularly, using a conductive liner in the process chamber to measure ion beam current.

BACKGROUND

Semiconductor workpieces are often implanted with dopant species to create a desired conductivity. For example, ion beams comprising ions containing the dopant species are accelerated toward a workpiece to implant the dopant species into the workpiece.

In ion implantation system, it is often necessary to measure the cumulative ion dose that is implanted in the semiconductor workpiece. The ion dose determines the effective conductivity of the implanted workpiece.

Typically, the ion beam current is measured by current measuring devices, which may be located in certain locations in the ion beam path. For example, in one embodiment, faraday cups are utilized. A faraday cup is made using a conductive material, typically formed having sides, a bottom and an open top, which may resemble a cup. Ions that enter through the open top strike the conductive material, thereby imparting their charge on that conductive material. The charge imparted on this faraday cup is then measured. This charge, when viewed in conjunction with the surface area of the bottom of the faraday cup, can be used to measure the density of the ion beam. This density can then be multiplied by the actual area of the ion beam, or the area of the workpiece, to determine the overall ion beam current being imparted on the workpiece.

This process is effective in cases where the width of the ion beam is greater than the width of the workpiece, as shown in FIG. 1. In this figure, the faraday cups 20 can be located just beyond the perimeter of the workpiece 30. The ion beam 10 strikes the workpiece 30, and also strikes the faraday cups 20 located outside the workpiece 30. In addition to requiring an ion beam 10 that is wider than the workpiece 30, this technique requires that the ion beam be relatively uniform, as the ion beam current sampled by faraday cups 20 located outside the workpiece 30 are assumed to be representative of the ion beam current that is implanting the workpiece 30.

As workpieces continue to grow in size, the amount of space available to locate faraday cups continues to decrease. In addition, the wider ion beams needed to implant these larger workpieces may not have an ion beam current that is as uniform as was previously achieved. This may be especially true with respect to workpieces having a width of 450 mm or greater.

Therefore, an improved system and method of measuring ion beam current in a process chamber would be beneficial.

SUMMARY

A system of measuring ion beam current in a process chamber using conductive liners is disclosed. A conductive liner is used to shield the walls of the process chamber. An ion measuring device, such as an ammeter, is used to measure the current created by the ions that impact the conductive liner. In some embodiments, a mechanism to contain secondary electrons generated in the process chamber is employed. Additionally, the ions that impact the scan system or workpiece may also be measured, thereby allowing the current of the entire ion beam to be measured.

In one embodiment, the ion beam measurement system comprises a process chamber defined by a plurality of chamber walls and having an entrance through which an ion beam is introduced; a conductive liner, disposed within the process chamber to shield the chamber walls; an electrical isolator to electrically isolate the conductive lining from the chamber walls; an ion measuring device in communication with the conductive liner to measure charge accumulated on the conductive liner; and a mechanism to contain secondary electrons generated within the process chamber.

In another embodiment, the ion beam measuring system comprises a process chamber defined by a plurality of chamber walls and having an entrance through which an ion beam is introduced; a conductive liner, comprising a plurality of conductive lining elements electrically coupled to one another using conductors, disposed within the process chamber to shield the chamber walls; a scanning system for moving a workpiece in a path of the ion beam; an electrical isolator to electrically isolate the conductive lining and the scanning system from the chamber walls; an ion measuring device in communication with the conductive liner to measure charge accumulated on the conductive liner; an ion measuring device in communication with the scanning system to measure charge accumulated on the scanning system and the workpiece; and a mechanism to contain secondary electrons generated within the process chamber.

In yet another embodiment, a method of measuring ion beam current is disclosed. The method of measuring the ion beam current introduced into an entrance of a process chamber comprises lining the process chamber with a conductive liner, electrically isolated from the process chamber; containing secondary electrons generated within the process chamber; measuring charge accumulated on the conductive liner; electrically isolating a scanning system, for moving a workpiece in a path of the ion beam, from the process chamber; and measuring charge accumulated on the scanning system and the workpiece.

BRIEF DESCRIPTION OF THE FIGURES

For a better understanding of the present disclosure, reference is made to the accompanying drawings, which are incorporated herein by reference and in which.

DETAILED DESCRIPTION

As described above, faraday cups are widely used to measure ion beam current in various ion implant systems. These ion implant systems may include plasma deposition (PLAD) systems, beamline implanter systems, flood implanter systems, and any other systems where ions are implanted into a workpiece. As such, the present disclosure is not limited to any particular ion implantation system or any particular process chamber.

Figure 1:
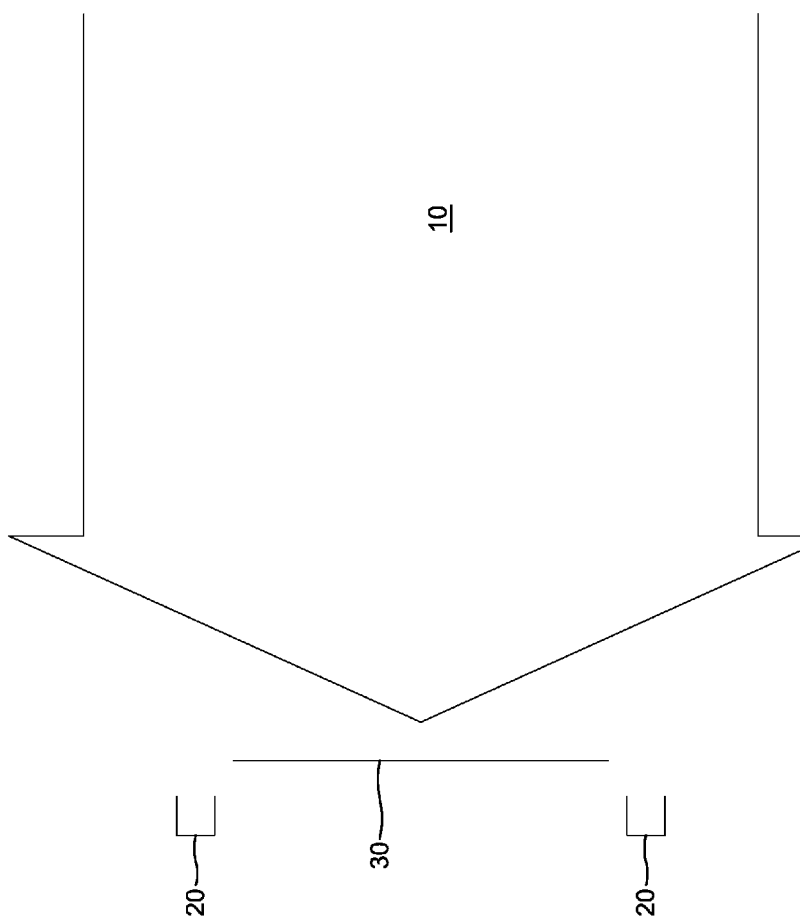
FIG. 1 shows an embodiment of an ion beam current measuring system according to the prior art.
Figure 2:
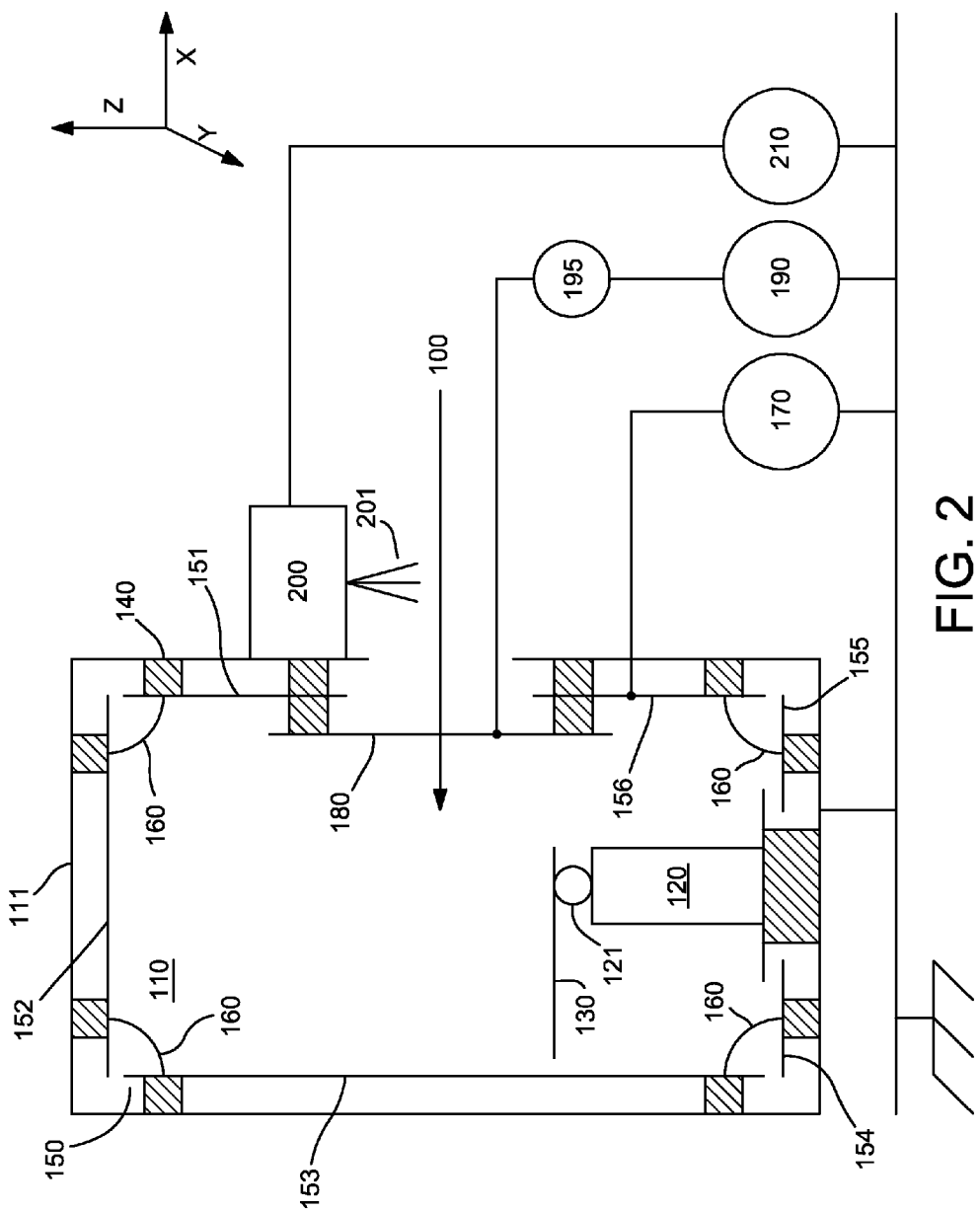
FIG. 2 shows an embodiment of an ion beam current measuring system according to one embodiment.

FIG. 2 shows a first embodiment of an ion beam current measurement system. In this system, an ion beam 100 is introduced to a process chamber 110. The process chamber 110 is made up of a plurality of chamber walls 111, which are typically made of a conductive material, which is electrically coupled to ground. A scanning system 120 is disposed within the process chamber 110. In one embodiment, the scanning system 120 moves through the ion beam 100. For example, in one embodiment, the scan system 120 moves in a direction orthogonal to the ion beam 100, such as in the Y direction. In other embodiments, the scan system 120 may scan in the X, Y or Z directions. The scan system 120 may have a rotatable element 121, such that the workpiece 130 can be rotated so as to be outside the path of the ion beam 100, as seen in FIG. 2.

Figure 3:
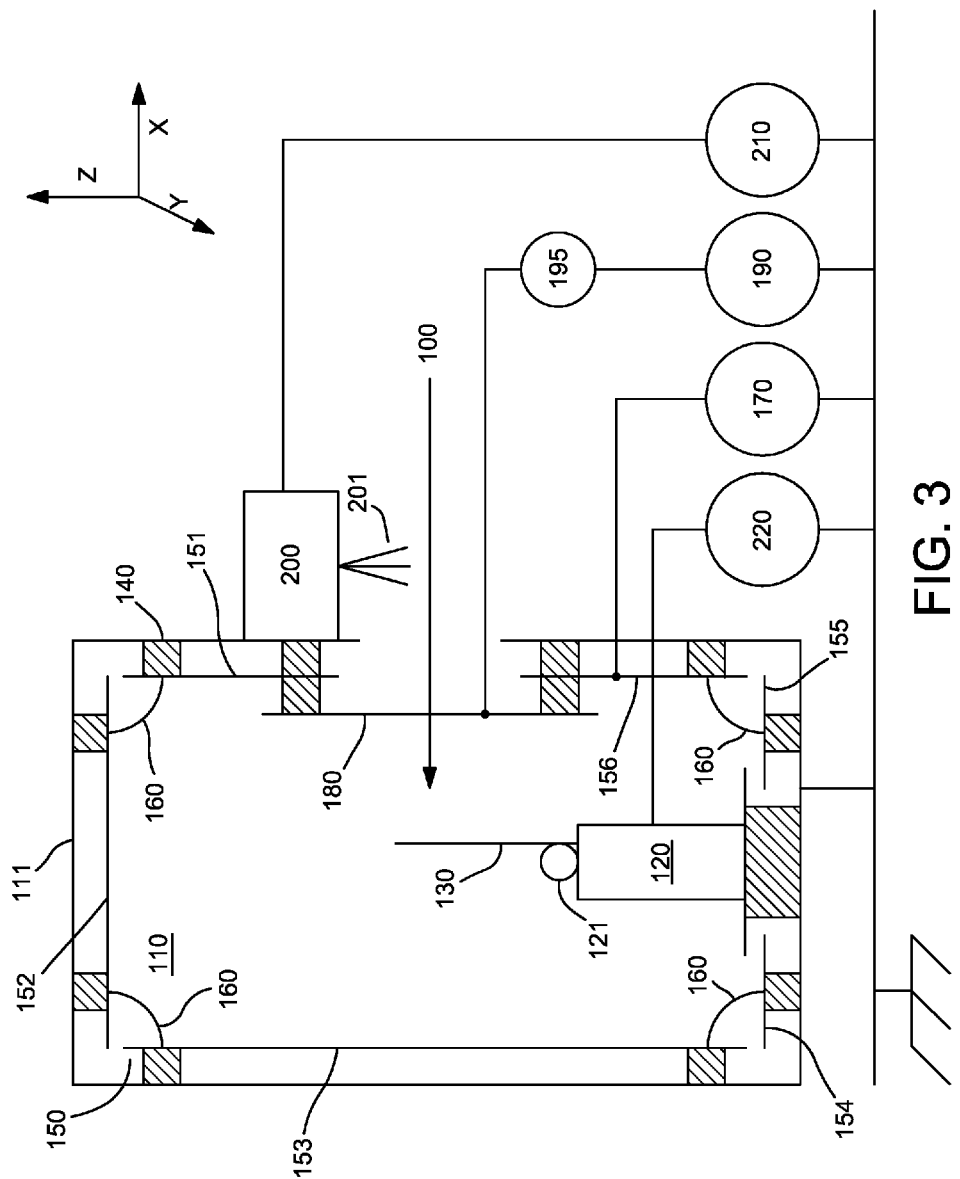
FIG. 3 shows an embodiment of an ion beam current measuring system when the workpiece is in the path of the ion beam.

Electrical isolators 140, shown in cross-hatch in FIGS. 2 and 3, are disposed on the inner surface of the chamber walls 111. A conductive liner 150 is disposed on these electrical isolators 140 so as to partially or totally shield the chamber walls 111 of the process chamber 110. In some embodiments, the conductive liner 150 is disposed such that ions from the ion beam 100 cannot impact the chamber walls 110.

In some embodiments, the conductive liner 150 is constructed from graphite, which is conductive and introduces few contaminants to the workpiece 130. This conductive liner 150 may be a single piece of material that covers the chamber walls 111. However, in some embodiments, the conductive liner 150 may be comprised of a plurality of individual conductive lining elements 151, 152, 153, 154, 155, 156, each of which lines only one chamber wall 111, or only a portion of a chamber wall 111. To couple these individual lining elements 151-156 together, a conductor, such as bonding straps 160, may be utilized. Although not shown in FIG. 2 or 3, all of the individual lining elements 151-156 are coupled together, thereby forming a single conductive lining 150. Other mechanisms which utilize a conductor to electrically connect the various individual conductive lining elements 151-156 may also be used.

The conductive liner 150 is in electrical communication with an ion measuring device 170. This ion measuring device 170 may be an ammeter for measuring the electrical current created by the charge imparted on the conductive liner 150. In other embodiments, the charge imparted on the conductive liner 150 is measured using a different technique, such as by using an I/V (current to voltage) converter. FIG. 2 shows an embodiment where the workpiece 130 is not impacted by the ion beam 100. In this embodiment, all of the ions may strike the conductive liner 150, and thus, the ion measuring device 170 may be able to measure the entire ion beam current.

In some cases, the impact of an ion with a surface, such as the conductive liner 150, causes the emission of secondary electrons. These secondary electrons typically are emitted from the impacted surface, and therefore, cause the impacted surface to be more positively charged. In other words, if an ion having a net charge of +1 impacts a surface, that surface should now experience a change in charge of +1. However, if a secondary electron is emitted from the surface, the surface will appear to have a change in charge of +2. Thus, in some embodiments, it is important to capture and measure these secondary electrons.

One mechanism that can be used to contain the secondary electrons is to positively bias the conductive liner 150. In this way, the emitted secondary electrons are attracted back toward the conductive liner 150, thereby insuring that they are correctly accounted from. This may be achieved through the use of a power supply (not shown) that applies a positive voltage to the conductive liner 150.

A second mechanism used to contain the secondary electrons is the use of a secondary electron suppression electrode 180. An electrode 180 is disposed at the entrance to the process chamber 110 and may have an aperture through which the ion beam 100 may pass. This electrode 180 may be negatively biased to repel any secondary electrons emitted from within the process chamber 110 back into the chamber 110. The electrode 180 may be electrically isolated from the conductive liner 150 through the use of electrical isolators 140. In this embodiment, the electrode 180 may be coupled to a power supply 190, which provides the negative bias. In some embodiments, there is no need to measure charge on the electrode 180, as it intended to repel electrons and therefore should not accumulate any negative charge. However, in some embodiments, the suppression electrode 180 may be impacted by positive ions, either directly from the incoming ion beam 100, or positive ions that have been reflected from the conductive liner 150. In this case, an ion measuring device 195, such as ion measuring device 170 used to measure charge accumulated on the conductive liner 150, may be introduced to measure ions that impact the electrode 180. In some embodiments, this ion measuring device 195 is incorporated into or connected to the power supply 190. In other embodiments, a separate ion measuring device 195 may be used to measure this accumulated charge.

In another embodiment, the suppression electrode 180 may be positively biased to capture the secondary electrons. In this case, a positive voltage is applied to the electrode 180, such as using the power supply 190, and the current created by the impact of secondary electrons may be measured. This can be performed using an ion measuring device 195 to measure charge on the suppression electrode 180.

A third mechanism to contain the secondary electrons created in the process chamber 110 may be through the generation of an external magnetic field. This magnetic field may be oriented in such a direction that secondary electrons travelling from within the process chamber 110 toward the opening in the process chamber 110 experience a force which propels them back toward the process chamber 110. This magnetic field may be generated using magnets placed, for example, near the aperture through which the ion beam 100 passes.

Thus, a number of different mechanisms may be used to contain secondary electrons. To summarize, these mechanisms include positively biasing the conductive liner 150 to attract the secondary electrons, disposing a charged or biased electrode 180 at the entrance to the process chamber 110, and employing a magnetic field at the entrance to the process chamber 110 to repel secondary electron back into the process chamber 110. Of course, other mechanisms for containing the secondary electrons may also be used.

In some embodiments, electrons are intentionally added to an incoming ion beam 100 to minimize blowup caused by space charge phenomenon. In one embodiment, an electron introduction device, such as plasma flood gun 200, is used to introduce electrons 201 to the incoming ion beam 100, however, other mechanisms to add electrons to the ion beam 100 may also be employed. The introduction of these electrons 201 to the ion beam 100 helps maintain the shape of the ion beam 100. However, it also reduces the net charge experienced by the conductive liner 150, as the added electrons 201 counteract the effect of the positive ions. Therefore, in embodiments that utilize a plasma flood gun 200 or other electron introduction device, it may be necessary to determine the number of electrons 201 that have been introduced to account for their effect on the overall accumulated charge. For example, an electron measuring device 210, such as an ammeter, may be used to measure the electrons 201 added to the ion beam 100.

Based on these measurement devices, it is possible to determine the total ion beam current introduced to the process chamber 110 in FIG. 2. This can be determined based on the charge impacted on the conductive liner 150, as measured by ion measuring device 170. The charge impacted by reflected ions on the electrode 180, which may be measured by an ion measuring device 195 incorporated in power supply 190 or in a separate device, is then added to the total measured by ion measuring device 170. The charge associated with the added electrons 201, as measured by electron measuring device 210 is then subtracted (as it is a negative value) from this total to account for the effect of the added electrons 201. This result represents the total ion beam current introduced into the process chamber 110.

In some embodiments, the total ion beam current can only be measured when the workpiece 130 is not in the path of the ion beam 100. However, in some embodiments, it may be beneficial to determine the total ion beam current while the workpiece 130 is in the path of the ion beam 100. FIG. 3 shows an embodiment where the workpiece 130 may be disposed in the path of the ion beam 100. In this figure, the workpiece 130 has been rotated by rotatable element 121 so as to be in the path of the ion beam 100. Of course, other methods of disposing the workpiece 130 in the path of the ion beam 100 may be used. In this embodiment, all of the ions will not be collected by the conductive liner 150 and the electrode 180 as they were in FIG. 2. In fact, a large number of ions will be implanted into the workpiece 130. Therefore, in order to create an accurate representation of the total ion beam current 100, it may be necessary to determine the amount of ions that impacted the workpiece 130.

In one embodiment, the scanning system 120 is electrically isolated from the chamber walls 111, such as by the use of electrical isolators 140. In this way, the ions that impact the workpiece 130, as well as the scanning system 120, will impart a charge on the isolated scanning system 120. By coupling an ion measuring device 220, such as an ammeter, to the scanning system 120, the net charge accumulated on the workpiece 130 and the scanning system 120 can be measured. Since the workpiece 130 is in electrical communication with the scanning system 120, any charge impacted on the workpiece 130 will be passed to the scanning system 120 and measured by the ion measuring device 220.

In this way, the charge accumulated on the scanning system 120 and workpiece 130 can be measured by the device 220. Any charge accumulated on the conductive liner 150 is measured by ion measuring device 170, and any charge accumulated on the electrode 180 can be measured by an ion measuring device. The charge of the added electrons 201 is then subtracted from this sum to account for these added electrons. The result represents the total ion beam current introduced into the process chamber 110. It should be noted that, in instances where the workpiece is not disposed in the path of the ion beam 100, the scanning system 120 may still develop an accumulated charge due to reflected ions. This accumulated charge will be measured by ion measuring device 220, thereby allowing an accurate determination of overall ion beam current.

In any of the embodiments described herein, a controller (not shown) may be in communication with ion measuring devices 170, 195, 220 and electron measuring device 210. This controller may determine the total ion beam current and adjust one or more parameters of the ion beam source to optimize the implant conditions. For example, the controller may change the ionization energy in the ion source (not shown) to affect the number of ions that are extracted to form ion beam 100.

Furthermore, the use of the conductive liner and scanning system to accumulate charge enables the total ion beam current to be continuously monitored. Conventional faraday cups may not receive the ion beam at all times, or may receive differing amounts of the ion beam as scanning occurs. In contrast, advantageously, the present disclosure describes a system and method whereby the total ion beam current can be measured at all time. This includes those times when the workpiece is in the path of the ion beam and those times when the workpiece is not in the path of the ion beam.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An ion beam measurement system, comprising:
a process chamber defined by a plurality of chamber walls and having an entrance through which an ion beam is introduced;
a conductive liner, disposed within said process chamber to shield said chamber walls;
an electrical isolator to electrically isolate said conductive lining from said chamber walls;
an ion measuring device in communication with said conductive liner to measure charge accumulated on said conductive liner; a scanning system for moving a workpiece in a path of said ion beam, wherein said scanning system is electrically isolated from said chamber walls; and further comprising an ion measuring device in communication with said scanning system to measure charge accumulated on said scanning system and said workpiece; and
a mechanism to contain secondary electrons generated within said process chamber.

2. The ion beam measurement system of claim 1, wherein said mechanism comprises a power source applying a positive voltage to said conductive liner.

3. The ion beam measurement system of claim 1, wherein said mechanism comprises a secondary electron suppression electrode disposed proximate said entrance, wherein said electrode is negatively biased to repel said secondary electrons toward said process chamber.

4. The ion beam measurement system of claim 3, further comprising an ion measuring device in communication with said suppression electrode to measure charge accumulated on said suppression electrode.

5. The ion beam measurement system of claim 1, wherein said mechanism comprises a magnetic field disposed near said entrance to repel said secondary electrons toward said process chamber.

6. The ion beam measurement system of claim 1, wherein said conductive liner comprises a plurality of conductive lining elements electrically coupled to one another using conductors.

7. The ion beam measurement system of claim 1, further comprising an electron introduction device, to add electrons to said ion beam.

8. The ion beam measurement system of claim 7, further comprising an electron measuring system in electrical communication with said electron introduction device to measure charge added to said ion beam by said electron introduction device.

9. An ion beam measuring system, comprising:
a process chamber defined by a plurality of chamber walls and having an entrance through which an ion beam is introduced;
a conductive liner, comprising a plurality of conductive lining elements electrically coupled to one another using conductors, disposed within said process chamber to shield said chamber walls;
a scanning system for moving a workpiece in a path of said ion beam;
an electrical isolator to electrically isolate said conductive lining and said scanning system from said chamber walls;
an ion measuring device in communication with said conductive liner to measure charge accumulated on said conductive liner;
an ion measuring device in communication with said scanning system to measure charge accumulated on said scanning system and said workpiece; and
a mechanism to contain secondary electrons generated within said process chamber.

10. The ion beam measurement system of claim 9, further comprising an electron introduction device, to add electrons to said ion beam.

11. The ion beam measurement system of claim 10, further comprising an electron measuring system in electrical communication with said electron introduction device to measure charge added to said ion beam by said electron introduction device.

12. The ion beam measurement system of claim 9, wherein said mechanism comprises a power source applying a positive voltage to said conductive liner.

13. The ion beam measurement system of claim 9, wherein said mechanism comprises a secondary electron suppression electrode disposed proximate said entrance, wherein said electrode is negatively biased to repel said secondary electrons toward said process chamber.

14. The ion beam measurement system of claim 13, further comprising an ion measuring device in communication with said suppression electrode to measure charge accumulated on said suppression electrode.

15. The ion beam measurement system of claim 9, wherein said mechanism comprises a magnetic field disposed near said entrance to repel said secondary electrons toward said process chamber.

16. A method of measuring the ion beam current introduced into an entrance of a process chamber, comprising:
lining said process chamber with a conductive liner, electrically isolated from said process chamber;
containing secondary electrons generated within said process chamber;
measuring charge accumulated on said conductive liner;
electrically isolating a scanning system, for moving a workpiece in a path of said ion beam, from said process chamber; and
measuring charge accumulated on said scanning system and said workpiece.

17. The method of claim 16, wherein electrons are added to said ion beam, said method further comprising:
measuring charge of said added electrons.

18. The method of claim 16, wherein said containing step comprises disposing a negatively biased suppression electrode at said entrance of the process chamber, said method further comprising measuring charge accumulated on said suppression electrode.

* * * * *